(12) United States Patent
Ausserlechner et al.

(10) Patent No.: US 10,578,419 B2
(45) Date of Patent: Mar. 3, 2020

(54) MAGNETIC ANGLE SENSOR DEVICE AND METHOD OF OPERATION

(71) Applicant: Infineon Technologies AG, Neubiberg (DE)

(72) Inventors: Udo Ausserlechner, Villach (AT); Wolfgang Granig, Seeboden (AT)

(73) Assignee: Infineon Technologies AG (DE)

( * ) Notice: Subject to any disclaimer, the term of this patent is extended or adjusted under 35 U.S.C. 154(b) by 4 days.

(21) Appl. No.: 15/713,877

(22) Filed: Sep. 25, 2017

(65) Prior Publication Data

US 2018/0087889 A1 Mar. 29, 2018

(30) Foreign Application Priority Data

Sep. 28, 2016 (DE) .......................... 10 2016 118 384

(51) Int. Cl.
| | |
|---|---|
| *G01B 7/30* | (2006.01) |
| *G01R 33/09* | (2006.01) |
| *G01B 7/00* | (2006.01) |
| *G01D 5/14* | (2006.01) |
| *G01D 5/165* | (2006.01) |
| *G01R 33/02* | (2006.01) |

(52) U.S. Cl.
CPC ............... *G01B 7/30* (2013.01); *G01B 7/003* (2013.01); *G01D 5/145* (2013.01); *G01D 5/147* (2013.01); *G01D 5/165* (2013.01); *G01R 33/02* (2013.01); *G01R 33/093* (2013.01)

(58) Field of Classification Search
USPC .......................... 324/207.12, 207.13, 207.25
See application file for complete search history.

(56) References Cited

U.S. PATENT DOCUMENTS

| | | | |
|---|---|---|---|
| 7,808,234 B2 | 10/2010 | Kurihara | |
| 7,906,961 B2 | 3/2011 | Abwa et al. | |
| 8,519,700 B2 | 8/2013 | Jerance et al. | |
| 8,736,258 B2 | 5/2014 | Trontelj | |
| 9,410,790 B2 | 8/2016 | Baccher | |
| 9,574,905 B2 | 2/2017 | Hirota et al. | |
| 2009/0267594 A1* | 10/2009 | Kather ..................... | G01B 7/30 324/207.25 |

(Continued)

FOREIGN PATENT DOCUMENTS

| | | |
|---|---|---|
| CN | 200996830 Y | 12/2007 |
| CN | 101253389 A | 8/2008 |

(Continued)

*Primary Examiner* — Steven L Yeninas
(74) *Attorney, Agent, or Firm* — Design IP (57) ABSTRACT

A magnetic angle sensor device and a method for operating such device is provided. The magnetic angle sensor device includes a shaft rotatable around a rotation axis; a magnetic field source coupled to the shaft; a first magnetic angle sensor configured to generate a first signal that represents a first angle based on a first diametric magnetic field from the magnetic field source applied to the first magnetic angle sensor; a second magnetic angle sensor configured to generate a second signal that represents a second angle based on a second diametric magnetic field from the magnetic field source applied to the second magnetic angle sensor; and a combining circuit configured to determine a combined rotation angle based on the first signal and on the second signal.

24 Claims, 6 Drawing Sheets

(56) References Cited

U.S. PATENT DOCUMENTS

| | | | | |
|---|---|---|---|---|
| 2009/0315547 A1* | 12/2009 | Abwa | ............... | G01R 33/02 |
| | | | | 324/244 |
| 2012/0038351 A1* | 2/2012 | Saruki | ............. | G01R 33/091 |
| | | | | 324/207.25 |
| 2012/0038359 A1* | 2/2012 | Saruki | ............... | B82Y 25/00 |
| | | | | 324/252 |
| 2014/0021943 A1* | 1/2014 | Watanabe | ............ | G01B 7/30 |
| | | | | 324/207.21 |
| 2014/0046625 A1 | 2/2014 | Baecher | | |
| 2014/0285188 A1* | 9/2014 | Kuwano | ............ | G01R 33/09 |
| | | | | 324/252 |
| 2015/0008907 A1 | 1/2015 | Janisch | | |
| 2015/0025761 A1* | 1/2015 | Kernebeck | ........ | G01D 5/145 |
| | | | | 701/60 |
| 2015/0066426 A1* | 3/2015 | Hirota | ................. | G01B 7/30 |
| | | | | 702/151 |
| 2015/0192432 A1* | 7/2015 | Noguchi | ........... | G01R 33/09 |
| | | | | 324/207.2 |
| 2015/0226581 A1* | 8/2015 | Schott | ............... | G01D 5/145 |
| | | | | 324/207.2 |
| 2017/0030742 A1* | 2/2017 | Mochizuki | ........ | G01D 5/145 |
| 2018/0087927 A1* | 3/2018 | Anagawa | ........ | G01D 5/24485 |

FOREIGN PATENT DOCUMENTS

| | | |
|---|---|---|
| CN | 101384883 A | 3/2009 |
| CN | 201517919 U | 6/2010 |
| CN | 101836085 A | 9/2010 |
| DE | 10 2005 060 713 A1 | 6/2007 |
| DE | 10 2012 203 158 A1 | 8/2013 |
| DE | 10 2012 015 792 A1 | 3/2014 |
| DE | 10 2014 114 679 A1 | 7/2015 |

\* cited by examiner

MAGNETIC ANGLE SENSOR DEVICE AND METHOD OF OPERATION

FIELD

The present disclosure relates generally to a magnetic angle sensor arrangement, and more particularly, to a magnetic angle sensor device configured to determine a rotational position or movement of a shaft and a method of operation.

BACKGROUND

A magnetic angle sensor may be used to detect a rotational position or movement of a shaft. Typically, a permanent magnet is attached to a rotatable shaft and a single magnetic field sensor is placed on the rotation axis and adjacent to the magnet.

A disadvantage of known solutions is that they are very sensitive to magnetic disturbances. For example, if the magnet generates a field of, e.g., 45 mT at the sensor elements, a magnetic disturbance amounting to, e.g., 3 mT (in a worst case direction perpendicular to the axis and orthogonal to the field of the magnet) leads to an error amounting to 3.8° (arctan(3/45)=3.8°), which is generally not acceptable.

SUMMARY

Embodiments provided herein relate to a magnetic angle sensor arrangement that determines a rotational position or movement of a shaft.

According to one or more embodiments, a magnetic angle sensor device includes: a shaft rotatable around a rotation axis; a magnetic field source, where the magnetic field source is connected to the shaft; a first magnetic angle sensor; and a second magnetic angle sensor. The first magnetic angle sensor is configured to determine a first signal that represents a first angle based on a first diametric magnetic field applied to the first magnetic angle sensor, and the second magnetic angle sensor is configured to determine a second signal that represents a second angle based on a second diametric magnetic field applied to the second magnetic angle sensor. A combining circuit is configured to determine a combined rotation angle based on the first signal and on the second signal.

According to one or more embodiments, a method for determining a combined rotation angle of a shaft using a magnetic angle sensor device is provided. The magnetic angle sensor device includes a shaft rotatable around a rotation axis, a magnetic field source connected to the shaft, a first magnetic angle sensor, and a second magnetic angle sensor. The method includes determining by the first magnetic angle sensor a first signal that represents a first angle based on a first diametric magnetic field applied to the first magnetic angle sensor; determining by the second magnetic angle sensor a second signal that represents a second angle based on a second diametric magnetic field applied to the second magnetic angle sensor; and determining the combined rotation angle based on the first signal and on the second signal.

According to one or more embodiments, a computer program product directly loadable into a memory of a digital processing device, including software code portions that enable the digital processing device to perform one or more methods described herein.

According to one or more embodiments, a computer-readable medium, e.g., non-transitory storage of any kind, is provided having computer-executable instructions adapted to cause a computer system to perform one or more methods described herein.

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

Examples described herein in particular refer to magnetic angle sensors, where a permanent magnet is attached to a rotatable shaft and a magnetic field sensor is placed on the rotation axis and adjacent to the magnet. The magnetic angle sensor detects the rotatable magnetic field, which points in diametric direction, and therefrom it infers the rotational position of the shaft.

Various sensors can be used, e.g., an anisotropic magneto-resistor (AMR), a giant magneto-resistor (GMR), a tunneling magneto-resistor (TMR), Hall-effect devices (e.g., Hall plates, vertical Hall-effect devices) or magnetic field-effect transistor (MAG-FET) (e.g., split-drain MAG-FETs).

The embodiments provided herein use several angle sensors and combine their outputs to derive an angle estimation which is robust against external disturbance fields.

This may be beneficial in harsh environments such as in a vehicle or car, where external magnetic fields generated by current-rails in the vehicle influence the accuracy of the magnetic angle measurement. This becomes particularly problematic in hybrid or electric cars which comprise a multitude of wires carrying high currents adjacent to or in the vicinity of the sensor system.

Figure 2:
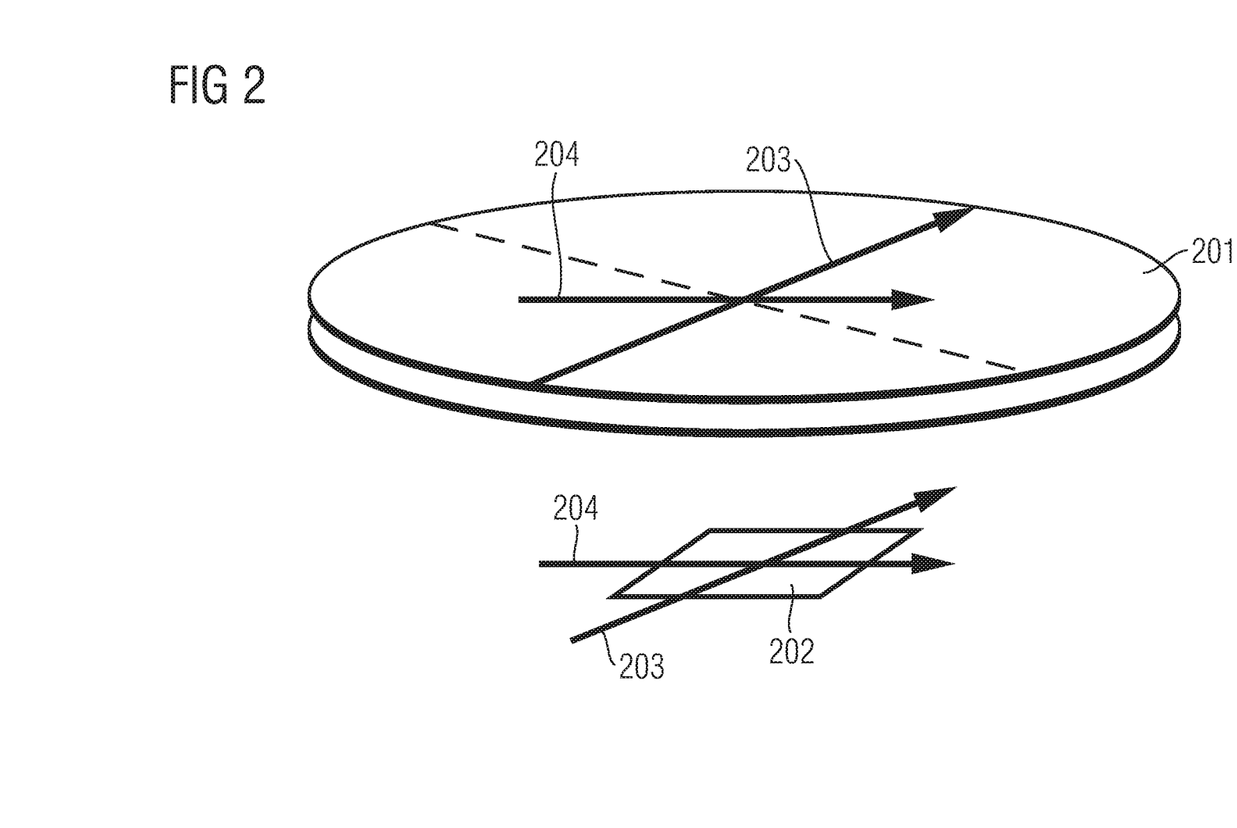
FIG. 2 shows a schematic diagram comprising a diametrically magnetized magnet and a magnetic angle sensor showing a magnetic target field vector and a disturbance field vector.

FIG. 2 shows an schematic diagram comprising a diametrically magnetized magnet 201 and a magnetic angle sensor 202. The magnet 201 has a magnetic target field vector 203; also, a disturbance field vector 204 is present. The disturbance field vector 204 superimposes with the target field vector 203 of the magnet 201 and generates an angle error on the magnetic angle sensor 202.

Figure 1:
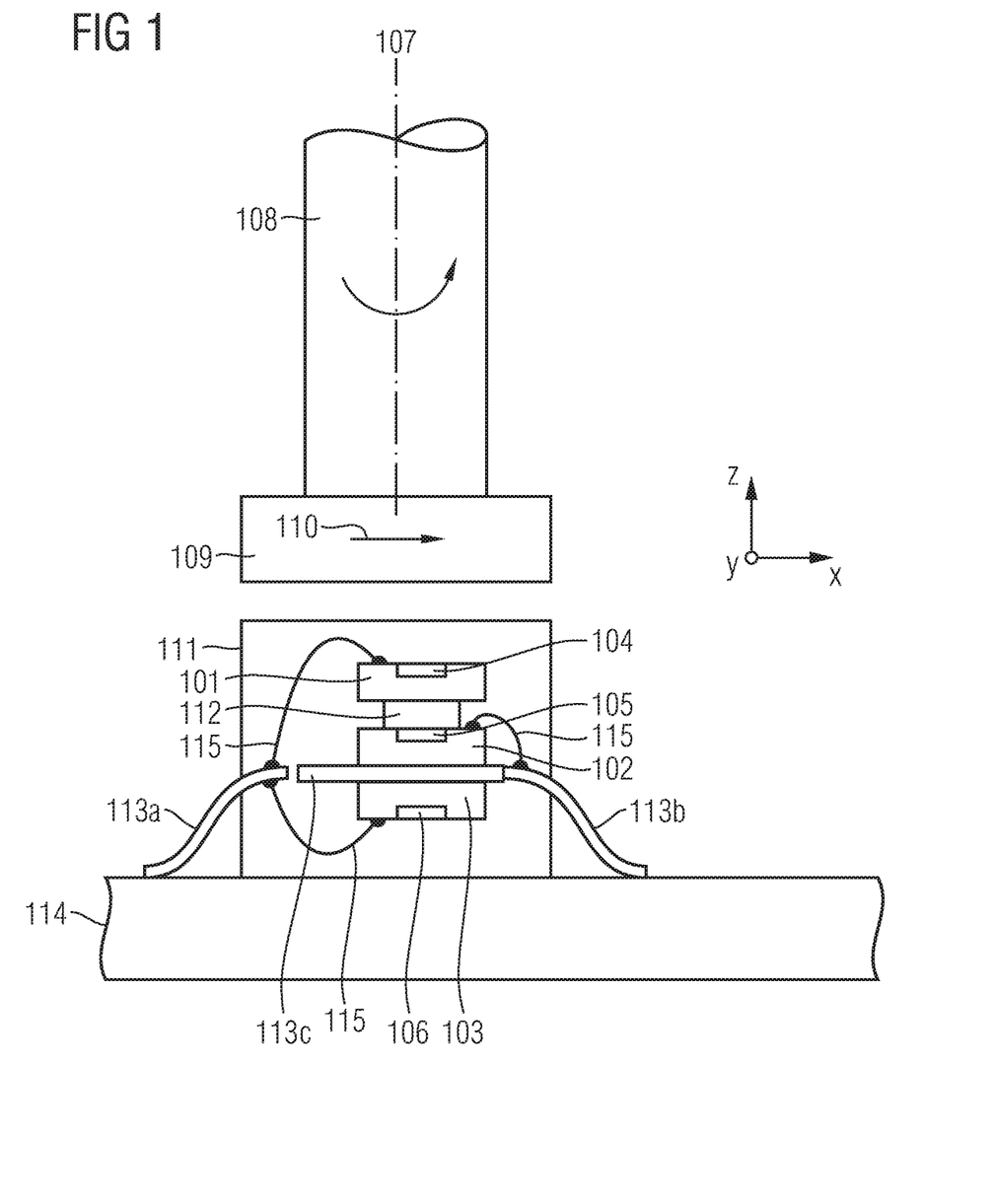
FIG. 1 shows an example embodiment of a sensor system including a shaft that rotates around a rotation axis, where a magnet is attached to the shaft and rotates above three magnetic angle sensors that are arranged on the rotation axis.

FIG. 1 shows an example arrangement comprising a shaft 108 that rotates around a rotation axis 107. A magnet 109 is attached to the bottom of the shaft 108, wherein the magnet has a magnetization 110 in x-direction. Three angle sensors 101, 102 and 103 are arranged within a mold body 111, which is arranged below the magnet 109. The distance between the magnet 109 and the mold body 111 may be in a range between 1 mm and 3 mm. Each of the angle sensors 101 to 103 comprises a sensor element 104 to 106. The angle sensors 101 to 103 are electrically connected to leads 113a, 113b via bond wires 115, wherein the mold body 111 is connected via the leads 113a, 113b to a printed circuit board 114.

The magnetic angle sensors 101 to 103 are of a type "perpendicular angle sensor", which means that they respond to the rotation angle of the shaft, wherein the magnetic field component affects a sensing surface of the respective angle sensor that is perpendicular to the rotation axis. They are arranged stacked to each other, so that the gravity centers of their sensor elements 104 to 106 are substantially located on the rotation axis 107 and they are at three different distances from the magnet 109 (i.e. at different z-positions). The angle sensor 101 and the angle sensor 102 are separated by a distance element 112, wherein the angle sensor 102 is located on top of a die paddle 113c. The angle sensor 103 is mounted below the die paddle 113c, wherein the sensor elements 105, 106 are arranged on opposite sides of the angle sensors 102, 103.

The angle sensor 101 detects an angle $\varphi_1$. The sensor element 104 of the angle sensor 101 is at an axial position $z_1$.

The angle sensor 102 detects an angle $\varphi_2$. The sensor element 105 of the angle sensor 102 is at an axial position $z_2$.

The angle sensor 103 detects an angle $\varphi_3$. The sensor element 106 of the angle sensor 103 is at an axial position $z_3$.

It is noted that each of the angle sensors 101 to 103 may comprise at least one sensor element 104 to 106.

It is noted that each angle sensor may comprise two vertical Hall devices (also referred to as vertical Hall effect devices). In an example embodiment, a first vertical Hall device is oriented such that it merely detects magnetic field components in a first direction (e.g., in x-direction, whereas magnetic field components in y- and z-direction are not detected by the first vertical Hall device). A second vertical Hall device is oriented such that it merely detects magnetic field components in a second direction, which is different from the first direction (e.g., in y-direction, whereas magnetic field components in x- and z-direction are not detected by the second vertical Hall device). The angle sensor determines a signal which corresponds to the arctan of the magnetic fields $B_x$ and $B_y$, i.e. $\arctan_2(B_x, B_y)$. This is equivalent to the angle between the magnetic field with a vanishing $B_z$-component and a positive x-axis. If the $B_z$-component of the magnetic field is set zero, a projection of the magnetic field perpendicular to the rotation axis can be obtained, which is parallel to the z-axis. This projection is also called diametric magnetic field.

It is an option that each angle sensor may comprise two Wheatstone bridges of magneto-resistive resistors. One bridge provides a signal that is proportional to the sine of an angle between the diametric magnetic field and the x-axis. The other bridge provides a signal that is proportional to the cosine of this angle. The angle sensor may thus provide the signal that corresponds to the arctan of this sine and cosine, i.e. $\arctan_2(\cos, \sin)$.

Each bridge comprises four resistors in an Wheatstone bridge arrangement. In case GMRs or TMRs are used, the resistors of the main diagonal of the sine bridge comprise a pinned layer, which is magnetized in positive y-direction. The resistors of the secondary diagonal of the sine bridge comprise a pinned layer, which is magnetized in negative y-direction. The resistors of the main diagonal of the cosine bridge comprise a pinned layer, which is magnetized in positive x-direction and the resistors of the secondary diagonal of the cosine bridge comprise a pinned layer, which is magnetized in negative x-direction.

In case AMR sensors are used, the signals of the bridges are proportional to $\cos(2\varphi)$ and $\sin(2\varphi)$ with $\varphi$ being the angle between the diametric magnetic field component and the positive x-axis. The resistors of the cosine bridge show a current flow in x-direction along the main diagonal and a current flow in y-direction along the secondary diagonal (positive or negative does not matter in this case). The resistors of the sine bridge show a current flow in x-direction plus 45 degrees (clock-wise) along the main diagonal and a current flow in x-direction minus 45 degrees (counter-clockwise) along the secondary diagonal.

A diametric magnetic field on the rotation axis 107 at the axial position $z_1$ which is generated by the rotatable magnet 109 amounts to $B_1$, which comprises the components $B_{x1}$ and $B_{y1}$ (the $B_z$-component is irrelevant). It is noted that "diametric" means a projection of the magnetic field vector on the x-y-plane, i.e. a field vector with no or no significant z-portion.

A diametric magnetic field on the rotation axis 107 at the axial position $z_2$ which is generated by the rotatable magnet 109 amounts to $k_2 \cdot B_1$, which comprises the components $k_2 \cdot B_{x1}$ and $k_2 \cdot B_{y1}$ (the $B_z$-component is irrelevant).

The diametric magnetic field on the rotation axis 107 at the axial position $z_3$ which is generated by the rotatable magnet 109 amounts to $k_3 \cdot B_1$, which comprises the components $k_3 \cdot B_{x1}$ and $k_3 \cdot B_{y1}$ (the $B_z$-component is irrelevant).

Further, a homogeneous disturbance field Bd may be present comprising the components $Bd_x$ and $Bd_y$ (the $B_z$-component is irrelevant).

The following applies:

$$\tan\varphi_1 = \frac{B_{y1} + Bd_y}{B_{x1} + Bd_x} \qquad \text{eq. (1)}$$

$$\tan\varphi_2 = \frac{k_2 \cdot B_{y1} + Bd_y}{k_2 \cdot B_{x1} + Bd_x} \qquad \text{eq. (2)}$$

$$\tan\varphi_3 = \frac{k_3 \cdot B_{y1} + Bd_y}{k_3 \cdot B_{x1} + Bd_x} \qquad \text{eq. (3)}$$

Hence, the rotational position $\varphi 0$ of the shaft 108 amounts to:

$$\tan\varphi_0 = \frac{B_{y1}}{B_{x1}} \qquad \text{eq. (4)}$$

Multiplying equation (1) with $(Bx1+Bdx)$ leads to:

$$(B_{x1}+Bd_x)\cdot\tan\varphi_1 = B_{y1}+Bd_y; \qquad \text{eq. (5)}$$

Multiplying equation (2) with $(k_2 \cdot B_{x1}+Bd_x)$ leads to:

$$(k_2 \cdot B_{x1}+Bd_x)\cdot\tan\varphi_2 = k_2 \cdot B_{y1}+Bd_y; \qquad \text{eq. (6)}$$

Multiplying equation (3) with $(k_3 \cdot B_{x1}+Bd_x)$ leads to:

$$(k_3 \cdot B_{x1}+Bd_x)\cdot\tan\varphi_3 = k_3 \cdot B_{y1}+Bd_y. \qquad \text{eq. (7)}$$

Subtracting equations (5) to (6) result in:

$$(B_{x1}+Bd_x)\cdot\tan\varphi_1-(k_2\cdot B_{x1}+Bd_x)\cdot\tan\varphi_2=B_{y1}-k_2\cdot B_{y1}. \quad \text{eq. (8)}$$

Subtracting equations (5) to (7) result in:

$$(B_{x1}+Bd_x)\cdot\tan\varphi_1-(k_3\cdot B_{x1}+Bd_x)\cdot\tan\varphi_3=B_{y1}-k_3\cdot B_{y1}. \quad \text{eq. (9)}$$

Equation (4) can be converted to:

$$B_{y1}=B_{x1}\cdot\tan\varphi_0$$

which allows replacing By1 in equations (8) and (9) leading to:

$$(B_{x1}+Bd_x)\cdot\tan\varphi_1-(k_2\cdot B_{x1}+Bd_x)\cdot\tan\varphi_2=(1-k_2)\cdot B_{x1}\cdot\tan\varphi_0; \quad \text{eq. (10)}$$

$$(B_{x1}+Bd_x)\cdot\tan\varphi_1-(k_3\cdot B_{x1}+Bd_x)\cdot\tan\varphi_3=(1-k_3)\cdot B_{x1}\cdot\tan\varphi_0. \quad \text{eq. (11)}$$

Separating Bdx at the left hand side of equations (10) and (11) leads to:

$$Bd_x(\tan\varphi_1-\tan\varphi_2)=(1-k_2)B_{x1}\tan\varphi_0-B_{x1}\tan\varphi_1+k_2 B_{x1}\tan\varphi_2; \quad \text{eq. (12)}$$

$$Bd_x(\tan\varphi_1-\tan\varphi_3)=(1-k_3)B_{x1}\tan\varphi_0-B_{x1}\tan\varphi_1+k_3 B_{x1}\tan\varphi_3; \quad \text{eq. (13)}$$

A division of equations (12)/(13) and solving the result for tan φ0 leads to:

$$\tan\varphi_0 = \frac{((\tan\varphi_1-\tan\varphi_3)(k_2\tan\varphi_2-\tan\varphi_1)-(\tan\varphi_1-\tan\varphi_2)(k_3\tan\varphi_3-\tan\varphi_1))}{((1-k_3)(\tan\varphi_1-\tan\varphi_2)-(1-k_2)(\tan\varphi_1-\tan\varphi_3))}. \quad \text{eq. (14)}$$

It is noted that the arctan-function is not without ambiguity across 360°. The arctan-function ranges only from −90° to +90°. In the examples used, a range from −180° to +180° would be preferable. This can be achieved via the function arctan 2(x,y), which is identical to the arctan(y/x), if x≥0. However, if x<0, the following applies:

$$\arctan_2(x,y) = \arctan\frac{y}{x} - \pi,$$

which is indicated in radians (rad). Hence, instead of equation (14), the following may apply:

$$\varphi_0=\arctan_2(A,B)$$

wherein $$A=(1-k_3)\cos\varphi_1\cos\varphi_3(\sin\varphi_1\cos\varphi_2\sin\varphi_2\cos\varphi_1)-(1-k_2)\cos\varphi_1\cos\varphi_2(\sin\varphi_1\cos\varphi_3-\sin\varphi_3\cos\varphi_1);$$

$$B=(\sin\varphi_1\cos\varphi_3-\sin\varphi_3\cos\varphi_1)\cdot(k_2\sin\varphi_2\cos\varphi_1-\sin\varphi_1\cos\varphi_2)-(\sin\varphi_1\cos\varphi_2-\sin\varphi_2\cos\varphi_1)\cdot(k_3\sin\varphi_3\cos\varphi_1-\sin\varphi_1\cos\varphi_3).$$

The arctan applied to the right hand side of equation (14) provides the rotation angle φ0. This computed rotation angle φ0 is no longer (significantly) affected and/or corrupted by the disturbance field. The angle sensors 101 to 103 provide their data to be input in the above equation (14). Also, the numbers k2 and k3 are used, which can be fixed numbers that may depend on the ratios of magnetic field strengths at the positions z2, z3 compared to the position z1. Advantageously, the positions z1, z2 and z3 are located on the rotation axis 107. Hence, based on the system design, the positions of the sensors 101 to 103 along the z-axis are known.

In case of significant axial play, this might affect the field strengths on the angle sensors 101 to 103, but the ratio of the field strength on the angle sensor 102 over the field strength on the angle sensor 101 (i.e. k2) and the ratio of the field strength on the angle sensor 103 over the field strength on the angle sensor 101 (i.e. k3) changes significantly less.

If the function of the absolute value of the diametric magnetic field B along the rotation axis (i.e. the z-axis) is a linear function over z, the numbers k2 and k3 are constants even in case the magnet 109 experiences axially shifts.

It is an option to utilize magnets that provide such linear relationship. For example, a small stud hole may be drilled into the surface of the magnet, in particular into the surface that faces the angle sensors 101 to 103 (in case all angle sensors are on the same side of the magnet 109).

Each of the angle sensors 101 to 103 may have a sensitive plane that is perpendicular to the rotation axis 107. In case of AMR, GMR, TMR or vertical Hall angle sensors, the sensitive plane may be (substantially) identical to the main surface of the die, which accommodates the sensor element(s).

The position of the sensor element 104 to 106 may thus be defined as an intersect point where the sensitive plane of the angle sensors 101 to 103 intersects the rotation axis 107.

The sensor elements 104 to 106 respond to a projection of the magnetic field vector into the sensitive plane at these intersect points. If the magnet 109 rotates around the rotation axis 107, this projection rotates as well, which results in two orthogonal magnetic field components Bx, By; the third magnetic field component Bz points out of the sensitive plane and it may be omitted in a first approximation for these types of angle sensors.

The diametric magnetic field strength may be denoted as:

$$\sqrt{B_x^2+B_y^2},$$

which is the strength of the projection of the field vector into the sensitive plane.

With regard to the terminology used herein, the axial and the lateral direction may be distinguished as follow: the axial direction is along the rotation axis 107 (z-axis); the lateral directions are perpendicular to the rotation axis, i.e., in the x-y-plane. Hence, there is an infinite number of lateral directions and only one axial direction.

As an option, the angle sensor 101 may be arranged in a first package on the top side of the printed circuit board 114 and the angle sensor 103 may be arranged in a second package on the bottom side of the printed circuit board 114. The angle sensor 102 may be arranged either within the first package or the second package.

It is noted that an increased reliability is another advantage of the system: the system allows obtaining three estimations of a rotation angle, i.e. φ1, φ2, φ3, which can be combined, e.g., for comparison purposes. For example, it may be decided that one of the angle sensor is defective if it produces a rotation angle that is substantially different (e.g., exceeding a predefined threshold for a variation between the rotation angles) from the rotation angles detected by the other two angle sensors. The defect may be notified, e.g., as an alarm, and/or the result of the defective angle may no longer used; in such example scenario, the rotation angles from the other two (non-defective) angle sensors may be averaged and used for further processing.

It is also an advantage that the system is able to determine whether the angle sensors 101 to 103 are monotonously distributed. In case of perfectly arranged angle sensors 101 to 103 and a homogeneous magnetic disturbance field, either:

$$\varphi_1 > \varphi_2 > \varphi_3$$

or $$\varphi_1 < \varphi_2 < \varphi_3.$$

applies (in a modulo-360°-scheme). If the angle sensors 101 to 103 are not monotonously distributed, there is some error: Either the angle sensors 101 to 103 malfunction or the disturbance field is highly inhomogeneous.

As an option, the system may check the monotony only if the differences between the rotation angles $\varphi 1$, $\varphi 2$ and $\varphi 3$ are above a predetermined threshold, which may be larger than an anticipated production spread. This avoids detecting an inhomogeneous distribution of angle sensors even in case there is none.

By inserting the rotation angle $\varphi 0$ in equations (12), (13) and (6), (7), the system is able to compute the ratios:

$$\frac{Bd_x}{B_{x1}} \text{ and } \frac{Bd_y}{B_{y1}}.$$

Equation (12) or equation (13) can be used to calculate Bdx/Bx1 based on the rotation angles $\varphi 1$, $\varphi 2$ and $\varphi 3$. This result can be inserted in equation (6) or in equation (7) to calculate Bdy/By1.

It is in particular an option to determine:

$$\frac{\sqrt{Bd_x^2 + Bd_y^2}}{\sqrt{B_{x1}^2 + B_{y1}^2}}, \quad \text{eq. (15)}$$

which is independent from the rotation angle and provides the ratio of disturbance field to target field (target field:the field of the magnet).

Bdx/Bx1 can be used to determine:

$$\frac{Bd_x}{\sqrt{B_{x1}^2 + B_{y1}^2}} = \frac{Bd_x \cdot \cos\varphi_0}{B_{x1}}. \quad \text{eq. (16)}$$

Accordingly, Bdy/By1 can be used to determine:

$$\frac{Bd_y}{\sqrt{B_{x1}^2 + B_{y1}^2}} = \frac{Bd_y \cdot \sin\varphi_0}{B_{y1}}. \quad \text{eq. (17)}$$

Both equations (16) and (17) can be combined to reach equation (15), i.e., equations (16) and equation (17) are both squared and then added and subsequently the root is extracted from this addition. The value provided by equation (15) can be compared with a predetermined threshold to indicate whether or not the disturbance field is within an acceptable range.

Hence, the system can determine the amount of disturbance in relation to the magnetic field of the magnet. This ratio can be compared with at least one predefined limit and the system may issue an alarm if the disturbance has become too large, which may lead to unreliable or inaccurate results.

According to an example, two angle sensors are used to derive the rotation/angle information. However, the embodiments are not limited thereto, and more than two angle sensors may be used, where each sensor generates angle information used to derive the final measurement (i.e., a combined rotation angle).

Figure 3:
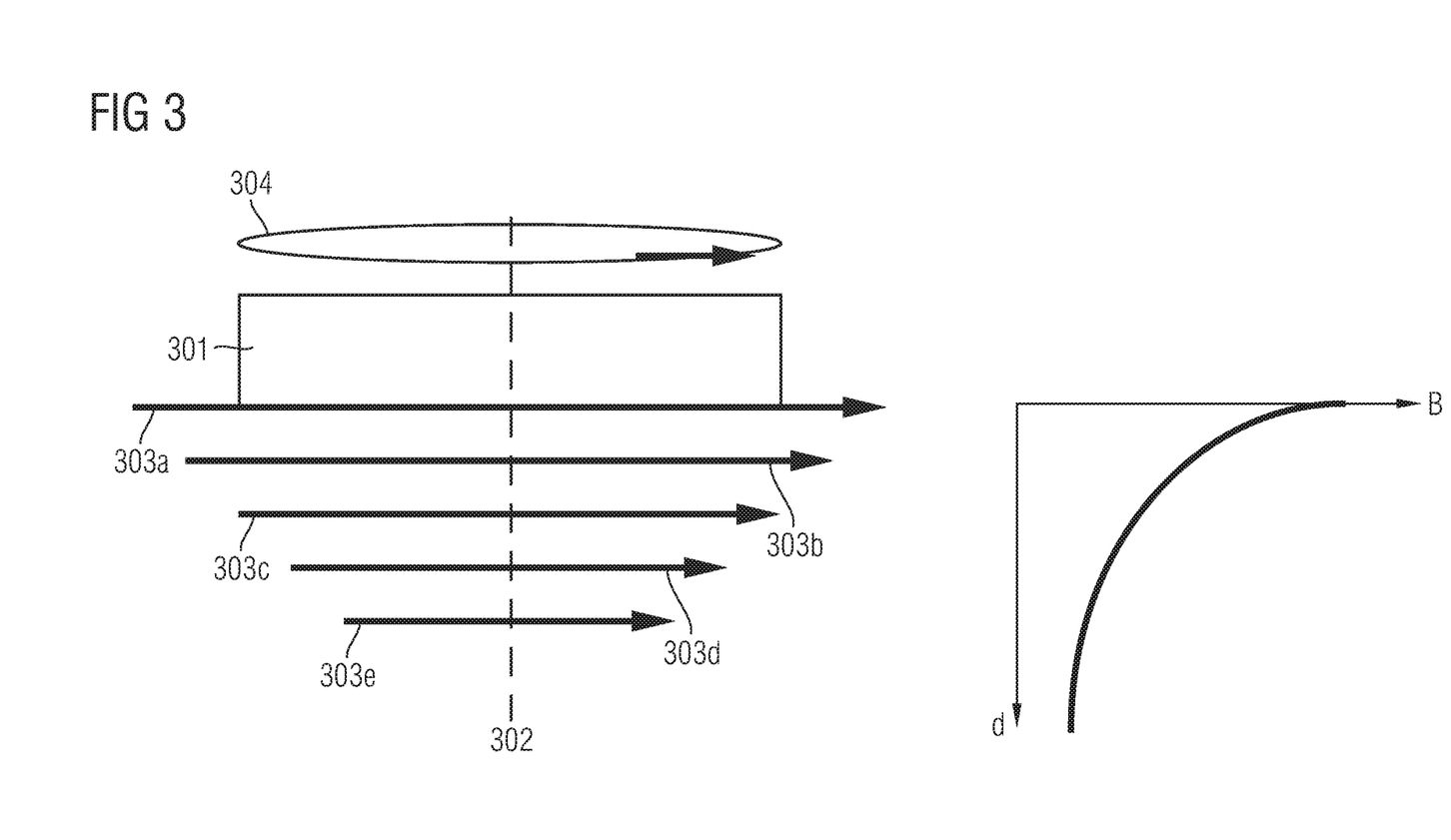
FIG. 3 shows a diametrically magnetized magnet that is arranged rotatably around a rotation axis.

The magnetic field of a magnet is strongly dependent on the distance of the sensor to the magnet. FIG. 3 shows a diametrically magnetized magnet 301 that is arranged rotatably around a rotation axis 302. An ellipse with an arrow 304 indicates a rotation of the magnet 301 around the rotation axis 302.

A magnetic target field is indicated by arrows 303*a* to 303*e*, wherein the size of the diametric magnetic field B decreases with an increasing distance d from the magnet 301; this is also indicated by a decreasing length of the arrows 303*a* to 303*e*. In other words, the lengths of the arrows 303*a* to 303*e* indicate the strength of the diametric magnetic field at an axial distance d from the magnet 301.

Figure 4:
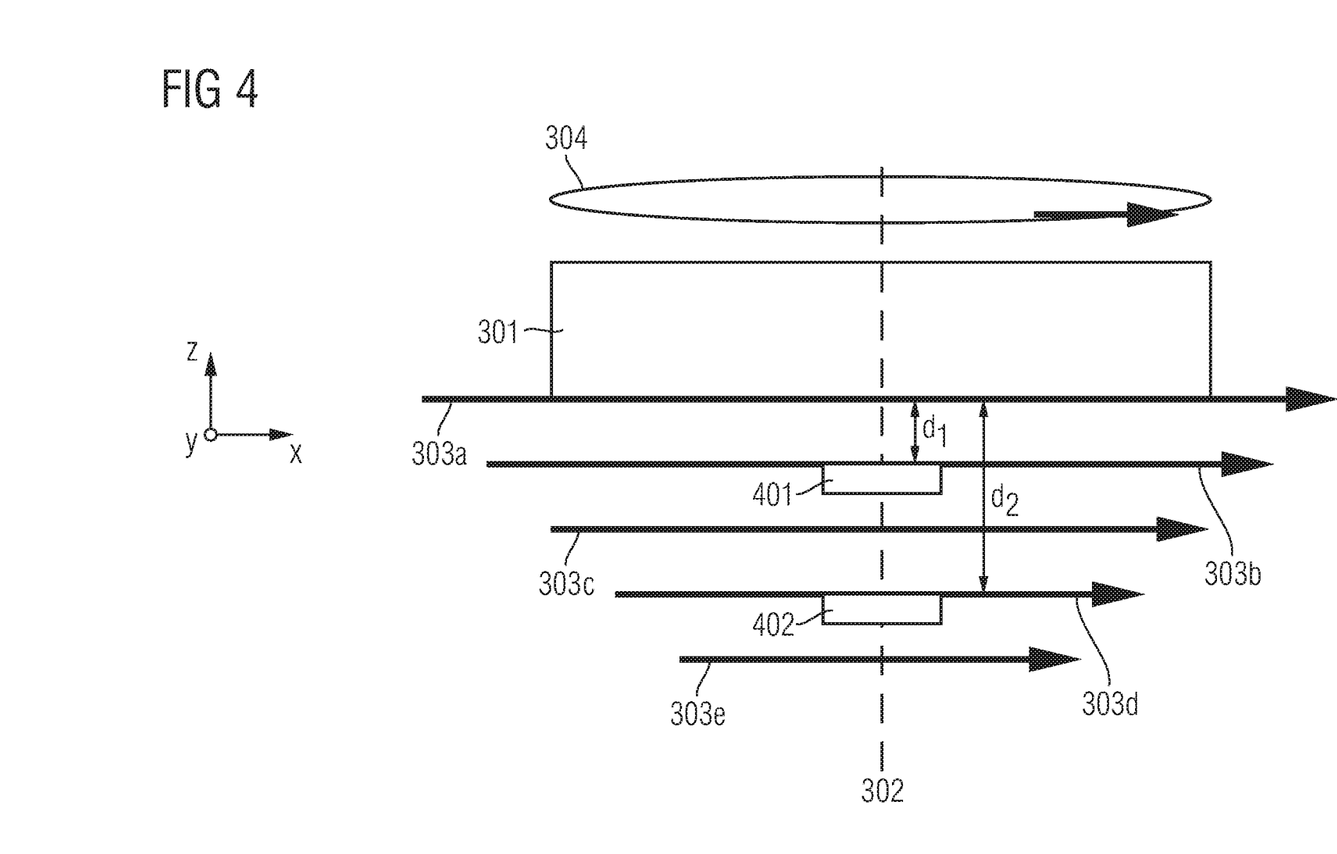
FIG. 4 shows the magnet illustrated in FIG. 3, where two angle sensors are placed on the rotation axis at different distances from the magnet.

FIG. 4 shows the magnet 301 and the rotation axis 302 of FIG. 3, wherein an angle sensor 401 is placed on the rotation axis 302 at a distance $d_1$ from the magnet 301 and an angle sensor 402 is placed on the rotation axis 302 at a distance $d_2$ from the magnet 301. In this example, the magnetic sensor elements are on top of the angle sensors 401 and 402.

In the presence of homogeneous disturbance fields, the angle sensors 401 and 402 may sense different rotation angles due to their differing distances $d_1$ and $d_2$ from the magnet 301, which result in different super-positions of fields from the magnet and disturbance field.

It is noted that in FIG. 4 a coordinate system with x-y-z-axes is shown, wherein the rotation axis 302 is along the z-axis and the sensors 401, 402 are arranged also in the x-y-plane.

Figure 5:
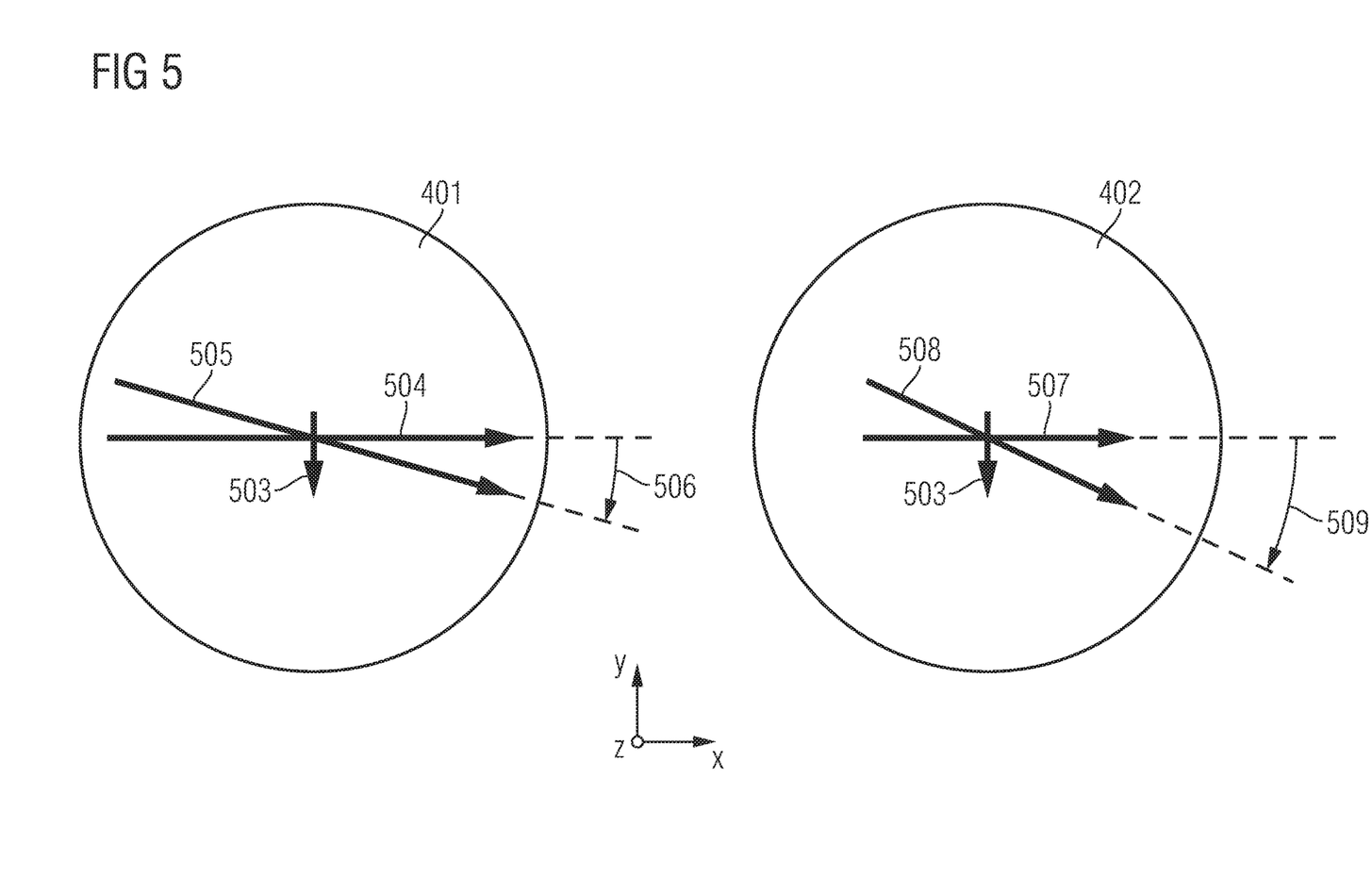
FIG. 5 shows the angle sensors illustrated in FIG. 4 from a different perspective indicating the rotational angle errors due to a disturbance field.

FIG. 5 shows the angle sensors 401 and 402, wherein both sensors experience a disturbance field vector 503, which is assumed to be of the same size for both angle sensors 401, 402. For the angle sensor 401, due to the disturbance field vector 503, a magnetic field vector 504 of the magnet 301 is skewed into a resulting magnetic field vector 505 leading to a rotation angle error 506. For the angle sensor 402, due to the disturbance field vector 503, a magnetic field vector 507 of the magnet 301 is skewed into a resulting magnetic field vector 508 leading to a rotation angle error 509.

Since the angle sensor 401 is closer to the magnet 301 than the angle sensor 402, the disturbance field vector 503 has a larger impact on the magnetic field vector 507 than on the magnetic field vector 504, which results in the rotation angle error 509 being larger than the rotation angle error 506.

Based on this example scenario, the actual rotation angle may be determined or approximated and even the size of the disturbance field may be determined or approximated. In order to achieve this, the field size of the magnet 301 is to be known.

It is noted that the coordinate system introduced in FIG. 4 is also shown in FIG. 5 to indicate the orientation of the angle sensors 401 and 402.

A linear combination of the rotation angles obtained by these two angle sensors may result in a rotation angle that is robust against disturbances.

The magnet 301 may point into a direction that is associated with 0° (as a starting reference). The angle sensors 401 and 402 may produce the following rotation angles:

$$\alpha_1 = \arctan\frac{Bd_n}{B_1 + Bd_p},$$

$$\alpha_2 = \arctan\frac{Bd_n}{B_2 + Bd_p},$$

where: $\alpha 1$ is the rotation angle determined by the angle sensors 401; $\alpha 2$ is the rotation angle determined by the angle sensors 402; Bdn is the diametric disturbance field component that is normal to the field of the magnet; Bdp is the diametric disturbance field component that is parallel to the field of the magnet; B1 is the diametric field of the magnet that affects the sensor 401; and B2 is the diametric field of the magnet that affects the sensor 402.

In case of a small disturbance field Bd the following applies:

$$\alpha_1 \approx \frac{Bd_n}{B_1},$$

$$\alpha_2 \approx \frac{Bd_n}{B_2} = \frac{Bd_n}{B_1} \cdot \frac{B_1}{B_2}.$$

A rotation angle $\alpha_{best\text{-}guess}$ may be determined as follows:

$$\alpha_{best\text{-}guess} = \alpha_1 + c \cdot (\alpha_1 - \alpha_2) = \frac{Bd_n}{B_1} + c \cdot \left(\frac{Bd_n}{B_1} - \frac{Bd_n}{B_1} \cdot \frac{B_1}{B_2}\right) = \frac{Bd_n}{B_1} \cdot \left(1 + c \cdot \left(1 - \frac{B_1}{B_2}\right)\right),$$

where c is a compensation factor.

The rotation angle $\alpha_{best\text{-}guess}$ should be 0°, because the magnet points in this 0° direction.

This results in:

$$\frac{Bd_n}{B_1} \cdot \left(1 + c \cdot \left(1 - \frac{B_1}{B_2}\right)\right) = 0,$$

$$c = \frac{1}{\frac{B_1}{B_2} - 1}.$$

An algorithm may be used to determine $\alpha_{best\text{-}guess} = \alpha_1 + c \cdot (\alpha_1 - \alpha_2)$.

The algorithm may use the constant c, which is given by the last equation and which depends only on the ratio of fields of the magnet on both angle sensors. Although the formula has been derived with the assumption of a special rotational position $\varphi = 0°$, it works for all rotational positions.

B1/B2 may for example amount to 1.5. This results in c=2 and $$\alpha_{best\text{-}guess} = \alpha_1 + 2 \cdot (\alpha_1 - \alpha_2) = 3\alpha_1 - 2\alpha_2.$$

Figure 6:
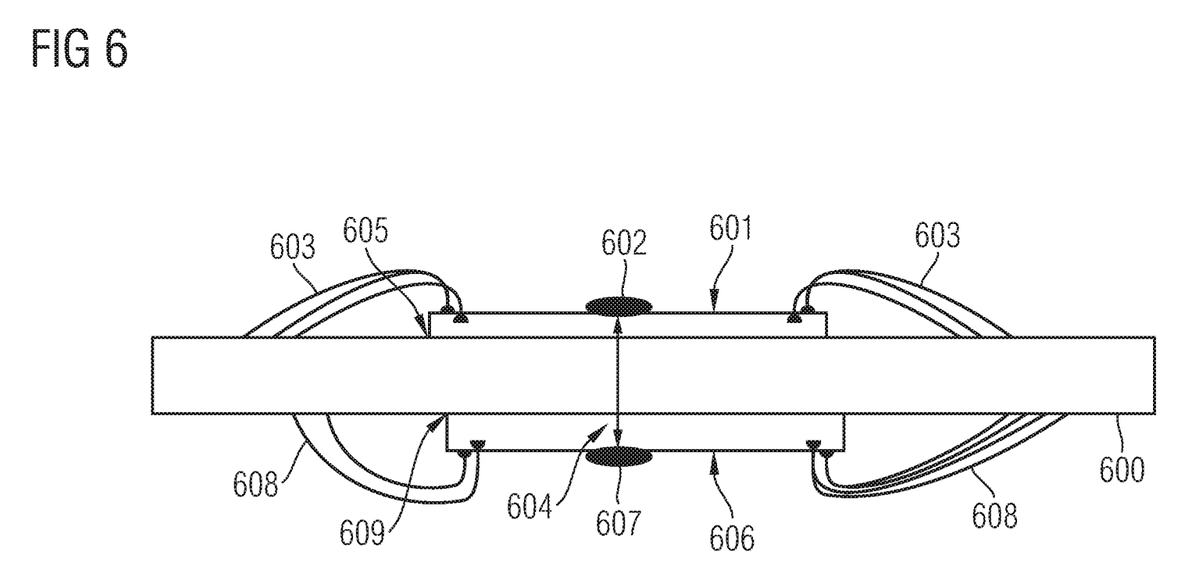
FIG. 6 shows an example arrangement of a dual-sensor-package.

FIG. 6 shows an example arrangement of a dual-sensor-package. A top die 601 is arranged on top of a leadframe 600, wherein an insulating glue 605 is arranged between the top die 601 and the leadframe 600. The top die 601 comprises a sensor element 602 and the top die 601 is electrically connected to the leadframe 600 via bond wires 603.

A bottom die 606 is arranged on the bottom of the leadframe 600, wherein an insulating glue 609 is arranged between the bottom die 606 and the leadframe 600. The bottom die 606 comprises a sensor element 607 and the bottom die 606 is electrically connected to the leadframe 600 via bond wires 608. In an example use case, the sensing elements 602 and 607 are spaced apart from each other by less than 600 μm.

In this dual-the setup the magnetic sensor elements 602 and 607 are on top of each other and both sensor elements 602, 607 are directly above each other so that they can be placed both on the rotation axis if the chips are orthogonal to the rotation axis.

A microcontroller (not shown in FIG. 6) can be connected to the leadframe 600 (and thereby to the sensor elements 602 and 607) to read the rotation angles and to perform the compensation to determine the combined rotation angle as proposed herein.

Advantageously, this approach allows for rotation angle measurements that are robust against disturbance fields.

The arrangement shown in FIG. 6 can be used to be placed below the magnet 301 of FIG. 4. In this case, the angle sensor 401 corresponds to the sensor element 602 and the angle sensor 402 corresponds to the sensor element 607. It is in particular an option to place the angle sensors 401 and 402 on separate or opposite sides of a printed circuit board (PCB) to increase the distance between the angle sensors (and the angle sensor elements). In this case, the angle sensors 401 and 402 may have packages on their own and each of the angle sensors 401 and 402 may comprise at least one angle sensor element. The packages may be placed on opposing sides of the printed circuit board (similar to what is described above with regard to FIG. 1).

It is also an option that the corrected rotation angle is calculated by one of the angle sensors if both angle sensors are integrated in a package. For example, a first angle sensor can be used for determining the corrected rotation angle in case the first and a second angle sensor are connected by bond wires or by leads: Hence, the first angle sensor obtains the data from the second angle sensor and computes the corrected (e.g., compensated) rotation angle based on the data determined by the first and the second angle sensors. In such scenario, a microcontroller may be provided for reading such corrected rotation angle from the first sensor.

Hence, this example utilizes the fact that the diametric field from the magnet is different at different distances from the magnet; placing angle sensors at different distances from the magnet allows for a robust setup to at least partially compensate magnetic disturbance fields.

The devices and methods provided herein may in particular be based on at least one of the following embodiments. In particular, combinations of the following features of the following embodiments could be utilized in order to reach a desired result. The features of the method could be combined with any feature(s) of the device, apparatus or system or vice versa.

A magnetic angle sensor device is provided including: a shaft rotatable around a rotation axis; a magnetic field source, wherein the magnetic field source is connected to the shaft; a first magnetic angle sensor and a second magnetic angle sensor, where the first magnetic angle sensor generates a first signal that represents first angle based on a first diametric magnetic field applied to the first magnetic angle sensor, where the second magnetic angle sensor generates a second signal that represents a second angle based on a second diametric magnetic field applied to the second magnetic angle sensor, and a combined rotation angle is determined based on the first signal and on the second signal.

A combining circuit (e.g., combining logic, a processor, and/or a microcontroller) may be operatively connected to the first magnetic angle sensor and the second magnetic angle sensor, and configured to receive the first signal and the second signal, and determine the combined rotation angle based on the first signal and on the second signal. The processor may be configured to generate a measurement signal that represents the combined rotation angle. The processor may use the measurement signal representing the combined rotation angle for further processing and/or may output the measurement signal to another device.

The magnetic field source is in particular rigidly attached to the shaft.

Each of the magnetic angle sensor may be a magnetic field angle sensor.

The magnetic field is a vector at each point. This vector can be decomposed into a vector parallel to the rotation axis and a vector orthogonal to the rotation axis. The latter is the diametric magnetic field.

If a chip is oriented with its major surface perpendicular to the rotation axis and magneto-resistive elements are sputtered to its major surface, these elements respond to diametric magnetic fields. The same chip may comprise vertical Hall effect devices, which also respond to diametric magnetic field components. Conversely, if Hall plates are oriented perpendicular to the rotation axis they respond to the axial magnetic field component.

In practice the chip may be tilted by a few degrees due to assembly tolerances. If the major surface of a chip is not exactly perpendicular to the rotation axis, the magneto-resistive elements on its major surface respond mainly to the diametric magnetic field component but also a little bit to the axial magnetic field component. As long as the normal to the major chip surface deviates by less than 10° from the direction of the rotation axis, the magneto-resistive elements still essentially see the diametric magnetic field components and only negligible axial magnetic field components.

As an option, Vertical Hall effect devices may be used, because they also detect predominately the diametric magnetic field components, i.e., the magnetic field components parallel to the major chip surface, which is essentially orthogonal to the rotation axis.

The example presented may be particularly robust against magnetic disturbance fields.

According to one or more embodiments, the first magnetic angle sensor determines/generates the first signal that represents the first angle between the first diametric magnetic field applied to the first magnetic angle sensor and a first reference direction, and the second magnetic angle sensor determines/generates the second signal that represents the second angle between the second diametric magnetic field applied to the second magnetic angle sensor and a second reference direction.

In an embodiment, the first reference direction and the second reference direction are the same.

In an embodiment, the magnetic angle sensor device include a third magnetic angle sensor, wherein the third magnetic angle sensor determines/generates a third signal that represents a third angle based on a third diametric magnetic field applied to the third magnetic angle sensor, and the combined rotation angle is determined based on the first signal, the second signal, and the third signal.

It is an option that more than three magnetic angle sensors are provided to determine the combined rotation angle.

In an embodiment, the third magnetic angle sensor determines the third signal that represents the third angle between the third diametric magnetic field applied to the third magnetic angle sensor and a third reference direction.

In an embodiment, at least two out of the following are the same: the first reference direction; the second reference direction; and the third reference direction.

In an embodiment, the magnetic field source includes at least one permanent magnet.

In an embodiment, the magnetic angle sensors are located at different z-positions (e.g., distances) from the magnetic field source, wherein each z-position is defined as a perpendicular dropped from the position of the magnetic angle sensor onto the rotation axis.

The magnetic field source has a minimum distance $d_{min}$ to the nearest magnetic angle sensor. A distance between this magnetic angle sensor and any other magnetic angle sensor may in particular be equal to or larger than $\frac{1}{5}$ $d_{min}$.

In an embodiment, each of the magnetic angle sensors includes at least one magnetic sensor element that is arranged substantially on the rotation axis or in particular spaced apart from the rotation axis by less than 1 mm.

It may be an option that the magnetic angle sensor includes a plurality of magnetic sensor elements. As not all magnetic sensor elements may be arranged on the very same spot, the magnetic sensor elements may be arranged adjacent to the rotation axis, in particular in a symmetrical pattern around the rotation axis. It is also an option to choose a somewhat asymmetrical pattern arranging at least two magnetic sensor elements around the rotation axis. In such scenario, the magnetic angle sensor may determine an angle slightly off the rotation axis, e.g., by 0.1 mm to 0.2 mm (e.g., up to 0.2 mm). Such positioning, however, is also covered by the term "substantially on the rotation axis".

In an embodiment, each of the magnetic angle sensors includes at least two magnetic sensor elements that are arranged such that the angle of the diametric field vector on the rotation axis is measured.

In an embodiment, each of the two magnetic angle sensors includes a magnetic sensor element, where at least one magnetic sensor element per magnetic angle sensor is arranged at a different distance from the magnetic field source.

Hence, the magnetic field provided by the magnetic field source may have a different impact on each of the magnetic angle sensors, i.e., on at least one of the magnetic sensor elements of the magnetic angle sensors.

In an embodiment, any of the signals includes two signal components, in particular a sine signal component and a cosine signal component.

For example, each of the magnetic angle sensors may provide a signal comprising a sine signal component and a cosine signal component.

In an embodiment, the magnetic angle sensors are arranged such that the diametric magnetic field strengths acting on the magnetic angle sensors caused by the magnetic field source are mutually different.

It is noted that the magnetic angle sensors may be arranged such that the diametric magnetic field strengths acting on the magnetic angle sensors caused by the magnetic field source are mutually different by at least 10%.

In an embodiment, the diametric magnetic fields acting on the magnetic angle sensors are mutually parallel or mutually antiparallel.

In an embodiment, the device further includes a combining circuit, which combines the signals provided by the magnetic angle sensors to determine the combined rotation angle.

The combining circuit may be arranged with either one of the magnetic angle sensors or it may be arranged externally. The combining may be in particular performed by a processor or microcontroller.

The combining circuit may combine the first signal and the second signal or the first, the second, and the third signal to derive the combined rotation angle.

The combined rotation angle is an output signal that is indicative of the rotational position of the shaft.

In an embodiment, the combined rotation angle is determined as a linear combination comprising the first signal and the second signal.

In an embodiment, the linear combination includes coefficients that depend on a ratio of the diametric magnetic fields of the magnetic field source onto the magnetic angle sensors.

In an embodiment, the linear combination includes coefficients that depend only on a ratio of the diametric magnetic fields of the magnetic field source onto the magnetic angle sensors.

In an embodiment, the combined rotation angle is determined based on a distance of the magnetic angle sensors from the magnetic field source.

For example, the combined rotational angle is determined based on the ratio of the diametric magnetic fields on the second versus the first magnetic angle sensor and on the third versus the first magnetic angle sensor (in case of three magnetic angle sensors).

The combined rotation angle may in particular be determined indirectly based on the distance of the magnetic angle sensors from the magnetic field source.

According to one or more embodiments, at least two of the magnetic angle sensors are on two different substrates, where a major surface of at least one substrate is perpendicular or substantially perpendicular to the rotation axis.

In an embodiment, the at least two substrates are located on the rotation axis of the shaft.

In an embodiment, the at least two substrates are attached to a single leadframe.

According to one or more embodiments, at least two of the magnetic angle sensors are on the same substrate and the major surface of this substrate is orthogonal or substantially orthogonal to the rotation axis of the shaft.

According to one or more embodiments, each of the magnetic angle sensors includes at least one out of the following group of sensor elements: an anisotropic magneto-resistor (AMR); a giant magneto-resistor (GMR); a tunneling magneto-resistor (TMR); a Vertical Hall effect device; a Hall plate; and/or a MAG-FET.

The magnetic angle sensors may be of different technologies (i.e., different types of sensors) to increase the robustness and diversity of the system. For example, one of the angle sensors may be a TMR and another other angle sensor may be an AMR or a Vertical Hall sensor. Using different technologies may mitigate the risk that both angle sensors fail under severe conditions.

According to one or more embodiments, a method is provided for determining a combined rotation angle of a shaft, where the shaft is arranged rotatably around a rotation axis and wherein a magnetic field source is connected to the shaft. The method includes: determining by a first magnetic angle sensor a first signal that represents a first angle based on a first diametric magnetic field from the magnetic field source applied to the first magnetic angle sensor; determining by a second magnetic angle sensor a second signal that represents a second angle based on a second diametric magnetic field from the magnetic field source applied to the second magnetic angle sensor; and determining the combined rotation angle based on the first signal and on the second signal.

In an embodiment, the method further includes determining by a third magnetic angle sensor a third signal that represents a third angle based on a third diametric magnetic field from the magnetic field source applied to the third magnetic angle sensor; and determining the combined rotation angle based on the first signal, the second signal and the third signal.

Also, a computer program product is provided that is directly loadable into a memory of a digital processing device, including software code portions that enable the digital processing device to perform one or more methods described herein.

Further, a computer-readable medium is provided having computer-executable instructions adapted to cause a computer system to perform one or more methods described herein.

In one or more examples, the functions described herein may be implemented at least partially in hardware, such as specific hardware components or a processor. More generally, the techniques may be implemented in hardware, processors, software, firmware, or any combination thereof. If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium, i.e., a computer-readable transmission medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a single hardware unit or provided by a collection of interoperative hardware units, including one or more processors as described above, in conjunction with suitable software and/or firmware.

Although various example embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

What is claimed is:

1. Magnetic angle sensor device comprising:
a shaft rotatable around a rotation axis;
a magnetic field source coupled to the shaft;
a first magnetic angle sensor configured to generate a first signal that represents a first error angle based on a first diametric magnetic field from the magnetic field source and a disturbance magnetic field, both applied to the first magnetic angle sensor, wherein the disturbance magnetic field causes a first resulting magnetic field vector to deviate from a first target magnetic field vector by the first error angle;
a second magnetic angle sensor configured to generate a second signal that represents a second error angle based on a second diametric magnetic field from the magnetic field source and the disturbance magnetic field, both applied to the second magnetic angle sensor, wherein the disturbance magnetic field causes a second resulting magnetic field vector to deviate from a second target magnetic field vector by the second error angle; and
a combining circuit configured to determine a combined rotation angle based on the first signal and on the second signal, wherein the combining circuit is configured to determine the first error angle and the second error angle, and determine the combined rotation angle based on the first error angle and the second error angle,
wherein the first magnetic angle sensor and the second magnetic angle sensor are located at different distances from the magnetic field source, where the different distances are measured from the magnetic field source along an extension of the rotation axis, and
wherein each of the first magnetic angle sensor and the second magnetic angle sensor are arranged such that a strength of the first diametric magnetic field acting on the first magnetic angle sensor is mutually different from a strength of the second diametric magnetic field acting on the second magnetic angle sensor.

2. The device according to claim 1, wherein:
the first magnetic angle sensor generates the first signal that represents the first error angle between the first diametric magnetic field applied to the first magnetic angle sensor and a first reference direction, and
the second magnetic angle sensor generates the second signal that represents the second error angle between the second diametric magnetic field applied to the second magnetic angle sensor and a second reference direction.

3. The device according to claim 2, wherein the first reference direction and the second reference direction are the same.

4. The device according to claim 1, further comprising:
a third magnetic angle sensor configured to generate a third signal that represents a third error angle based on a third diametric magnetic field from the magnetic field source and the disturbance magnetic field, both applied to the third magnetic angle sensor, wherein the disturbance magnetic field causes a third resulting magnetic field vector to deviate from a third target magnetic field vector by the third error angle,
wherein the combining circuit is configured to determine the combined rotation angle based on the first signal, the second signal and the third signal.

5. The device according to claim 4, wherein:
the first magnetic angle sensor generates the first signal that represents the first error angle between the first diametric magnetic field applied to the first magnetic angle sensor and a first reference direction,
the second magnetic angle sensor generates the second signal that represents the second error angle between the second diametric magnetic field applied to the second magnetic angle sensor and a second reference direction, and
the third magnetic angle sensor generates the third signal that represents the third error angle between the third diametric magnetic field applied to the third magnetic angle sensor and a third reference direction.

6. The device according to claim 5, wherein at least two out of the following are the same: the first reference direction; the second reference direction; and the third reference direction.

7. The device according to claim 1, wherein the magnetic field source comprises at least one permanent magnet.

8. The device according to claim 1, wherein each of the first magnetic angle sensor and the second magnetic angle sensor comprises at least one magnetic sensor element that is arranged substantially on the rotation axis, spaced apart from the rotation axis by less than 1 mm.

9. The device according to claim 1, wherein:
the first magnetic angle sensor comprises at least two magnetic sensor elements that are arranged such that the first error angle of a diametric field vector on the rotation axis is measured, and
the second magnetic angle sensor comprises at least two magnetic sensor elements that are arranged such that the second error angle of a diametric field vector on the rotation axis is measured.

10. The device according to claim 1, wherein the first magnetic angle sensor comprises a first magnetic sensor element and the second magnetic angle sensor comprises a second magnetic sensor element, the first magnetic sensor element and the second magnetic sensor element being arranged at different distances from the magnetic field source.

11. The device according to claim 1, wherein each of the first signal and the second signal comprises a sine signal component and a cosine signal component.

12. The device according to claim 11, wherein the first and the second diametric magnetic fields acting on the first and the second magnetic angle sensors, respectively, are mutually parallel or mutually antiparallel.

13. The device according to claim 1, wherein the combining circuit is configured to determine the combined rotation angle as a linear combination comprising the first signal and the second signal.

14. The device according to claim 13, wherein the linear combination comprises coefficients that depend on a ratio of the first and the second diametric magnetic fields of the magnetic field source onto the first and the second magnetic angle sensors, respectively.

15. The device according to claim 13, wherein the linear combination comprises coefficients that depend only on a ratio of the first and the second diametric magnetic fields of the magnetic field source onto the first and the second magnetic angle sensors, respectively.

16. The device according to claim 1, wherein the combining circuit is configured to determine the combined rotation angle based on distances of the first and the second magnetic angle sensors from the magnetic field source.

17. The device according to claim 1, wherein the first and the second magnetic angle sensors are arranged on two different substrates, and wherein a major surface of at least one of the two different substrates is perpendicular or substantially perpendicular to the rotation axis.

18. The device according to claim 17, wherein the two different substrates are located on the rotation axis of the shaft.

19. The device according to claim 17, wherein the two different substrates are attached to a single leadframe.

20. The device according to claim 1, wherein the first and the second magnetic angle sensors are arranged on a same substrate and a major surface of the substrate is orthogonal or substantially orthogonal to the rotation axis of the shaft.

21. The device according to claim 1, wherein the combining circuit is configured to determine a field strength of the disturbance magnetic field based on the first signal and the second signal.

22. The device according to claim 21, wherein the combining circuit is configured to compare the field strength of the disturbance magnetic field with a predetermined threshold, and generate a warning if the field strength of the disturbance magnetic field exceeds the predetermined threshold.

23. A method for determining a combined rotation angle of a shaft, wherein the shaft is arranged rotatably around a rotation axis and wherein a magnetic field source is connected to the shaft, the method comprising:

generating, by a first magnetic angle sensor, a first signal that represents a first error angle based on a first diametric magnetic field from the magnetic field source and a disturbance magnetic field, both applied to the first magnetic angle sensor, wherein the disturbance magnetic field causes a first resulting magnetic field vector to deviate from a first target magnetic field vector by the first error angle;

generating, by a second magnetic angle sensor, a second signal that represents a second error angle based on a second diametric magnetic field from the magnetic field source and the disturbance magnetic field, both applied to the second magnetic angle sensor, wherein the disturbance magnetic field causes a second resulting magnetic field vector to deviate from a second target magnetic field vector by the second error angle; and determining the combined rotation angle based on the first signal and on the second signal, including determining the first error angle and the second error angle, and determining the combined rotation angle based on the first error angle and the second error angle, wherein the first magnetic angle sensor and the second magnetic angle sensor are located at different distances from the magnetic field source, where the different distances are measured from the magnetic field source along an extension of the rotation axis, and wherein each of the first magnetic angle sensor and the second magnetic angle sensor are arranged such that a strength of the first diametric magnetic field acting on the first magnetic angle sensor is mutually different from a strength of the second diametric magnetic field acting on the second magnetic angle sensor.

24. The method according to claim 23, further comprising:

generating, by a third magnetic angle sensor, a third signal that represents a third error angle based on a third diametric magnetic field from the magnetic field source and the disturbance magnetic field, both applied to the third magnetic angle sensor, wherein the disturbance magnetic field causes a third resulting magnetic field vector to deviate from a third target magnetic field vector by the third error angle; and determining the combined rotation angle based on the first signal, the second signal and the third signal.

* * * * *